United States Patent
Hsu et al.

(10) Patent No.: US 11,153,957 B2
(45) Date of Patent: Oct. 19, 2021

(54) APPARATUS AND METHOD FOR GENERATING AN ELECTROMAGNETIC RADIATION

(71) Applicant: TAIWAN SEMICONDUCTOR MANUFACTURING COMPANY LTD., Hsinchu (TW)

(72) Inventors: Tzu Jeng Hsu, Hsinchu (TW); Chi-Ming Yang, Hsinchu (TW); Chyi Shyuan Chern, Taipei (TW); Jui-Chun Peng, Hsinchu (TW); Heng-Hsin Liu, New Taipei (TW); Chin-Hsiang Lin, Hsin-Chu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/505,156

(22) Filed: Jul. 8, 2019

(65) Prior Publication Data
US 2020/0137863 A1    Apr. 30, 2020

Related U.S. Application Data

(60) Provisional application No. 62/753,370, filed on Oct. 31, 2018.

(51) Int. Cl.
*H05G 2/00*    (2006.01)

(52) U.S. Cl.
CPC ............. *H05G 2/003* (2013.01); *H05G 2/008* (2013.01)

(58) Field of Classification Search
CPC .......... H05G 2/00; H05G 2/001; H05G 2/003; H05G 2/005; H05G 2/008; G03F 7/70175;
(Continued)

(56) References Cited

U.S. PATENT DOCUMENTS 8,764,995 B2    7/2014   Chang et al.
8,796,666 B1    8/2014   Huang et al.
(Continued)

FOREIGN PATENT DOCUMENTS

TW    201736978 A     10/2017
WO    WO 2014169071 A1    10/2014
WO    WO 2018127565 A2    7/2018

OTHER PUBLICATIONS

Office Action and Search Report dated Sep. 21, 2020 issued by Taiwan Intellectual Property Office for counterpart application No. 108134460.

*Primary Examiner* — Jason L McCormack
(74) *Attorney, Agent, or Firm* — WPAT, P.C.; Anthony King (57) ABSTRACT

An electromagnetic radiation generation apparatus includes a collector, a gas supplier and a gas pipeline. The collector has a reflection surface configured to reflect an electromagnetic radiation. The collector includes a bottom portion, a perimeter portion, and a middle portion between the bottom portion and the perimeter portion. The middle portion of the collector includes a plurality of openings. The gas supplier is configured to provide a buffer gas. The gas pipeline is in communication with the gas supplier and the collector, and configured to purge the buffer gas through the openings of the middle portion to form a gas protection layer near the reflection surface of the collector. The openings of the middle portion include a plurality of holes arranged in an array including a plurality of rows of holes, or a plurality of concentric gaps.

20 Claims, 10 Drawing Sheets

(58) Field of Classification Search
CPC . G03F 7/70033; G03F 7/70916; G03F 7/2004
USPC .................................................... 250/504 R
See application file for complete search history.

(56) References Cited

U.S. PATENT DOCUMENTS

| | | | |
|---|---|---|---|
| 8,828,625 | B2 | 9/2014 | Lu et al. |
| 8,841,047 | B2 | 9/2014 | Yu et al. |
| 8,877,409 | B2 | 11/2014 | Hsu et al. |
| 9,093,530 | B2 | 4/2015 | Huang et al. |
| 9,184,054 | B1 | 11/2015 | Huang et al. |
| 9,256,123 | B2 | 2/2016 | Shih et al. |
| 9,529,268 | B2 | 12/2016 | Chang et al. |
| 9,548,303 | B2 | 1/2017 | Lee et al. |
| 2006/0219959 | A1* | 10/2006 | Hergenhan .......... G03F 7/70841 250/504 R |
| 2009/0057567 | A1* | 3/2009 | Bykanov ................ H05G 2/005 250/429 |
| 2011/0170079 | A1* | 7/2011 | Banine ................ G03F 7/70175 355/30 |
| 2011/0226745 | A1* | 9/2011 | Nagai ................. G03F 7/70033 219/121.62 |
| 2011/0253349 | A1* | 10/2011 | Ershov ................ G03F 7/70891 165/109.1 |
| 2013/0126761 | A1* | 5/2013 | Nagai .................... H05G 2/005 250/504 R |
| 2015/0077729 | A1* | 3/2015 | Van Empel ......... G03F 7/70891 355/30 |
| 2016/0179012 | A1* | 6/2016 | Brandt .............. G02B 19/0095 250/504 R |
| 2016/0366756 | A1* | 12/2016 | Wu ..................... G03F 7/70033 |
| 2017/0315446 | A1 | 11/2017 | Ueda et al. |
| 2018/0246422 | A1* | 8/2018 | Mulder ............... G03F 7/70033 |
| 2019/0155179 | A1* | 5/2019 | Wu ..................... G03F 7/70025 |

* cited by examiner

APPARATUS AND METHOD FOR GENERATING AN ELECTROMAGNETIC RADIATION

PRIORITY CLAIM AND CROSS-REFERENCE

This application claims priority of U.S. provisional application Ser. No. 62/753,370 filed on Oct. 31, 2018, which is incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. This scaling down process generally provides benefits by increasing production efficiency and lowering related manufacturing costs. Such scaling down, however, has also increased the complexity of IC manufacturing. To fabricate extremely small features, extreme ultraviolet lithography is developed.

The EUV can be formed along with plasma by irradiating a target material with a laser beam, and the generated EUV radiation is then collected and transmitted to an exposure system by a collector. During generation of the plasma and EUV however, debris of the target material and plasma by-products such as ions of the target material tend to deposit on the collector, thereby damaging the collect and deteriorating its optical performance.

BRIEF DESCRIPTION OF THE DRAWINGS

Aspects of the embodiments of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and sec and features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

In one or more embodiments of the present disclosure, an apparatus and a method for generating an electromagnetic radiation such as EUV radiation are provided. The electromagnetic radiation generation apparatus includes a collector having openings for purging a buffer gas. The buffer gas purged through the openings of the collector helps to create a gas protection layer and/or a turbulence substantially throughout a reflection layer of the collector, which can alleviate deposition of the target material on the reflection surface, improve the reflection effect of the collector, and prolong the lifetime of the collector.

Figure 1:
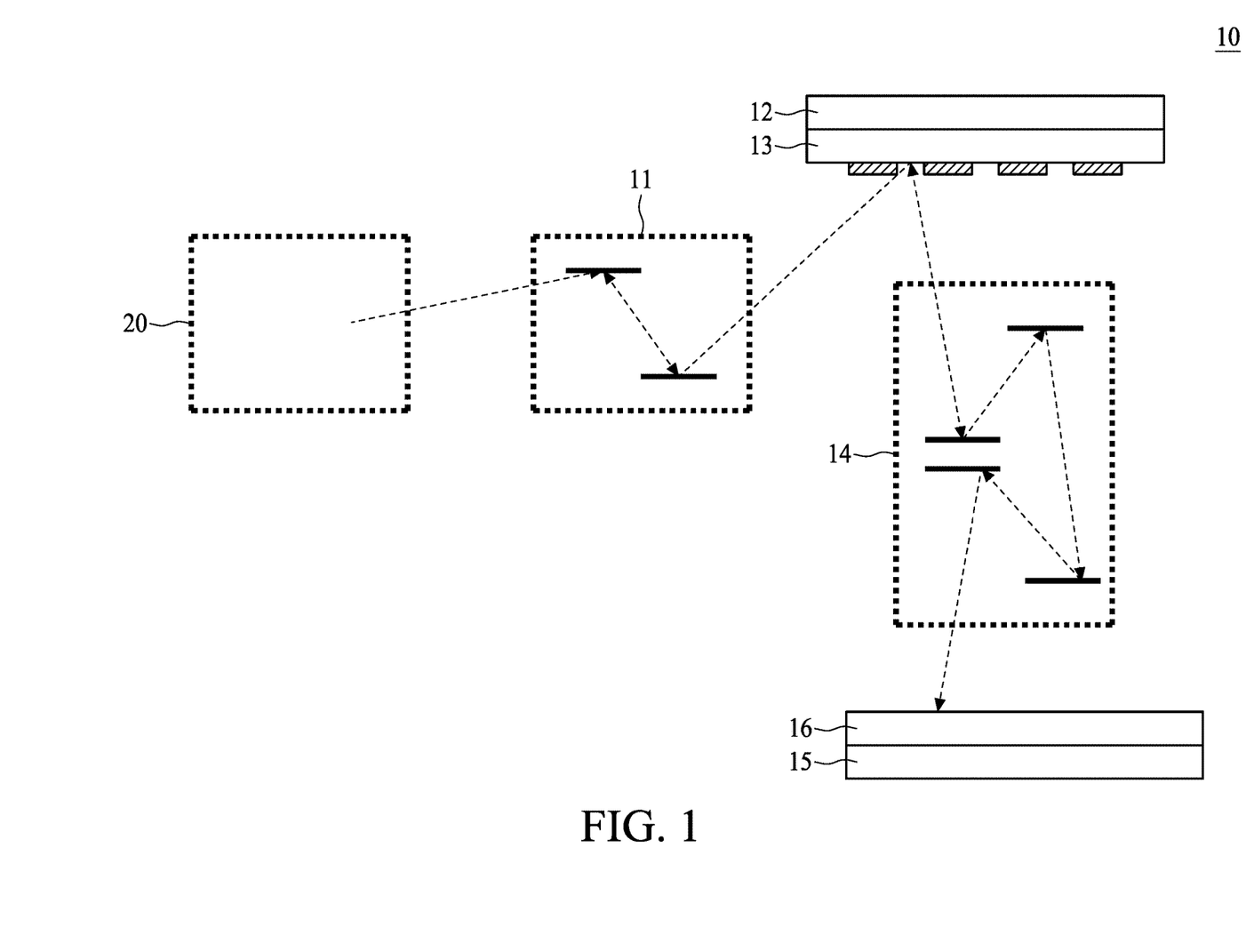
FIG. 1 is a schematic view diagram illustrating an electromagnetic radiation generation apparatus, in accordance with some embodiments of the present disclosure.

Refer to FIG. 1. FIG. 1 is a schematic view diagram illustrating an electromagnetic radiation generation apparatus, in accordance with some embodiments of the present disclosure. The electromagnetic radiation generation apparatus 10 is configured to generate an electromagnetic radiation R. The electromagnetic radiation generation apparatus 10 may include, but is not limited to, an extreme ultraviolet (EUV) lithography system operable to perform lithography exposing operation with EUV radiation. The EUV lithography system is configured to radiate an EUV radiation on a resist layer having a material sensitive to the EUV radiation. The electromagnetic radiation generation apparatus 10 includes a radiation source 20 configured to generate an EUV radiation, such as an EUV radiation having a wavelength ranging between about 1 nm and about 100 nm. In some embodiments, the radiation source 20 generates an EUV radiation with a wavelength centered at about 13.5 nm, but is not limited thereto. In some embodiments, the radiation source 20 may utilize a mechanism of laser-produced plasma (LPP) to generate the EUV radiation, which will be further described later.

The electromagnetic radiation generation apparatus 10 may further include an illuminator 11. The illuminator 11 may include various refractive optic components such as a single lens or a lens system having multiple lenses, or alternatively reflective optics such as a single mirror or a mirror system having multiple mirrors, to direct the electromagnetic radiation R from the radiation source 20 to a reticle (photomask) 13 mounted on a mask carrier 12. In some embodiments, the mask carrier 12 may include an electrostatic chuck (E-chuck) to secure the reticle 13. In some embodiments, the electromagnetic radiation generation apparatus 10 is an EUV lithography system, and the reticle 13 is a reflective mask. The reticle 13 may include a substrate formed by a low thermal expansion material (LTEM) such as quartz, titanium oxide doped silicon oxide, or other suitable materials. The reticle 13 may further include a multiple reflective multiple layers disposed on the substrate. The multiple reflective multiple layers include a plurality of film pairs, such as molybdenum-silicon (Mo/Si) film pairs (e.g., a layer of molybdenum and a layer of silicon stacked to each other in each film pair). In some other embodiments, the multiple reflective multiple layers may include molybdenum-beryllium (Mo/Be) film pairs, or other suitable materials that are configurable to highly reflect the EUV radiation. The reticle 13 may further include other layers such as a capping layer and an absorption layer. The capping layer such as ruthenium (Ru) may be disposed on the multiple reflective multiple layers for protection purpose. The absorption layer such as a tantalum boron nitride layer may be disposed on the multiple reflective multiple layers, and configured to define the pattern of a layer of an integrated circuit (IC) to be exposed. In some other embodiments, the absorption layer may be replaced with a reflective layer, for example in a phase shift mask.

The electromagnetic radiation generation apparatus 10 may also include a projection optical unit 14 for transferring the pattern of the reticle 13 to a layer 16 to be patterned disposed on a substrate (not shown). The layer 16 includes a material such as a photoresist, which is sensitive to the electromagnetic radiation R. The substrate such as a semiconductor wafer may be mounted on a substrate carrier 15. In some embodiments, the projection optical unit 14 may include reflective optics. The electromagnetic radiation R directed from the reticle 13 carries the image of the pattern defined on the reticle 13, and is conveyed to the layer 16 by the projection optical unit 14. In some embodiments, the layer 16 exposed to the electromagnetic radiation R can be patterned by exposure and development. In some embodiments, the patterned layer 16 may be then used as an etching mask to define the pattern of underlying layer(s).

Figure 2:
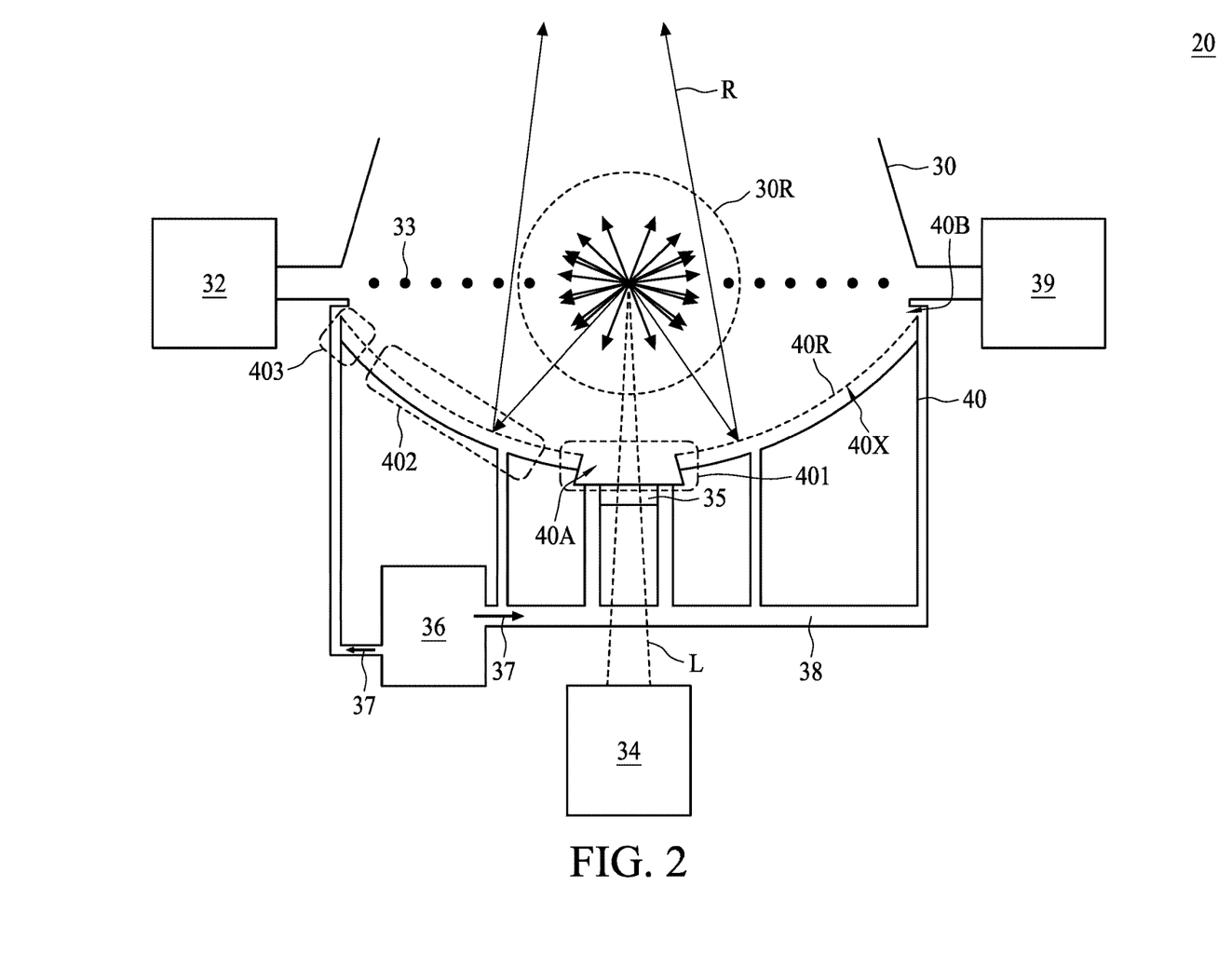
FIG. 2 is a schematic view diagram illustrating a radiation source, in accordance with some embodiments of the present disclosure.
Figure 3:
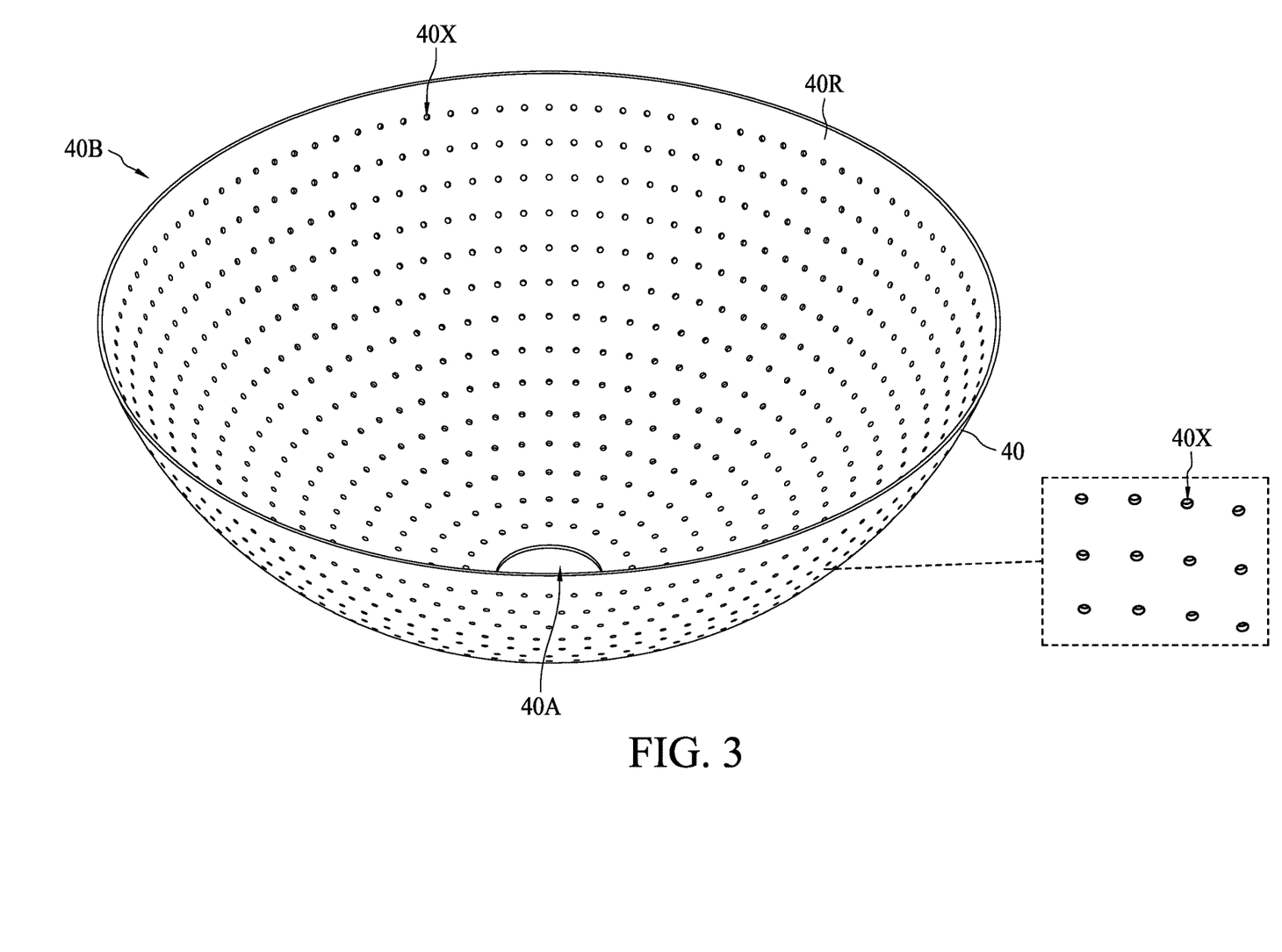
FIG. 3 is a schematic view diagram illustrating a collector, in accordance with some embodiments of the present disclosure.

Refer to FIG. 2 and FIG. 3. FIG. 2 is a schematic view diagram illustrating a radiation source, in accordance with some embodiments of the present disclosure, and FIG. 3 is a schematic view diagram illustrating a collector, in accordance with some embodiments of the present disclosure. As shown in FIGS. 1-3, the radiation source 20 of the electromagnetic radiation generation apparatus 10 includes a chamber 30, a target material supplier 32, a light source 34 and a collector 40. In some embodiments, the radiation source 20 employs a laser produced plasma (LPP) mechanism to generate plasma and further generate the electromagnetic radiation R from the plasma. During operation, the chamber 30 may be maintained at a low-pressure state or vacuum state. The chamber 30 includes an excitation region 30R in which a target material 33 is excited to generate the electromagnetic radiation R. The target material supplier 32 is connected to the chamber 30 and configured to supply a target material 33 to the excitation region 30R. In some embodiments, the target material supplier 32 may be connected to a sidewall of the chamber 30, and supplies the target material 33 to the excitation region 30R from a side direction. The light source 34 is configured to emit a light beam L on the target material 33 in the excitation region 30R, for example at a first focus of the collector 40, to generate plasma and an electromagnetic radiation R. In some embodiments, the light source 34 emits the light beam L to the excitation region 30k from the bottom center of the collector 40. For example, the light beam L is directed through an output window 35 integrated into the bottom center of the collector 40. The output window 35 may be made of a suitable material substantially transparent to the light beam L. In some embodiments, the light beam L, may include a pulse light. In some embodiments, the light source 34 may include a laser source system configured to emit a laser beam. The laser beam may include, for example, $CO_2$ laser or the like. The wavelength of $CO_2$ laser may be within a middle infra-red wavelength range, e.g., within the range of about 9 micrometers to about 11 micrometers. $CO_2$ laser may produce relatively high conversion efficiency on some target material 33 such as tin (Sn). The target material 33 can be excited by the light beam L, and converted into a plasma state, with generation of electromagnetic radiation R within EUV wavelength range. The electromagnetic radiation R is generated during de-excitation and recombination of ions emitted from the plasma.

The radiation source 20 may include a substantially vessel shape, and may be placed in a proper orientation. In some embodiments, the radiation source 20 may be placed in a tilted manner, for example, at a tilted angel of about 30 degrees.

The collector 40 is disposed under the chamber 30. The collector 40 has a reflection surface 40k configured to collect and reflect the electromagnetic radiation R. The collector 40 is designed with proper coating material and shape, functioning as a mirror for. EUV collection, reflection and focus. In some embodiments, the collector 40 has an ellipsoidal geometry, and the reflection surface 40k includes an elliptical sphere surface. The excitation region 30k is substantially at a first focus of the elliptical sphere surface. The collector 40 can collect the electromagnetic radiation R, reflect the electromagnetic radiation R to a second focus of the elliptical sphere surface of the collector 40, and direct the electromagnetic radiation R toward the illuminator 11. In some embodiments, the collector 40 may include a reflector mirror, which can reflect the electromagnetic radiation R, and focus the electromagnetic radiation R to the second focus. By way of example, the collector 40 may include a multi-layer mirror (MLM) capable of reflecting EUV light within a designated wavelength range.

In some embodiments, the radiation source 20R may further include a target material catcher 39 connected to the chamber 30, and configured to catch the remaining target material 33. The target material catcher 39, for example, may be connected to another sidewall of the chamber 30 opposite to the target material supplier 32, so as to catch the remaining target material 33.

In addition to generating the electromagnetic radiation R such as EUV light, undesirable plasma by-products also appear in the excitation region 30k. For example, the plasma by-products such as target material vapor may include neutral atoms and ions of the target material 33 when generating the EUV light. Also, debris of the target material 33 not excited by the light beam L would also appear in the excitation region 30k when generating the EUV light. The debris, atoms and ions of the target material 33 tend to travel toward the collector 40, and would deposit on the reflection surface 40k of the collector 40. The debris, atoms and ions of the target material 33 deposited on the collector 40 deteriorate the optical performance such as reflectivity of the collector 40, potentially damage the collector 40, and shorten lifetime of the collector 40.

In view of the problems caused by plasma by-product and debris of the target material 33, a gas supplier 36 and a gas pipeline 38 are incorporated in the collector 40. The gas supplier 36 is configured to provide a buffer gas 37. The gas pipeline 38 in communication with the gas supplier 36 and the collector 40, and configured to purge the buffer gas 37 through the collector 40 to form a gas protection layer near the reflection surface 40k of the collector 40. The buffer gas 37 may be reactive to the target material 33 to form a gaseous product. The gaseous product can be easily exhausted from the chamber 30, and thus the debris of the target material 33 can be reduced. In some embodiments, a pump (not shown) may be used to pump the gaseous product out of the chamber 30, and valves (not shown) may be utilized to control the flow of the buffer gas 37. In some embodiments, the target material includes tin (Sn), and the first buffer gas includes hydrogen gas ($H_2$). Hydrogen gas is able to react with tin, forming gaseous tin hydride ($SnH_4$). The gaseous tin hydride can be exhausted from the chamber 30 by, e.g., a pump, such that the amount of tin debris can be reduced.

The collector 40 may include a bottom portion 401, a perimeter portion 403, and a middle portion 402 between the bottom portion 401 and the perimeter portion 403. In some embodiments, the bottom portion 401 of the collector 40 may include a bottom center hole 40A, and the gas pipeline 38 is in communication with the gas supplier 36 and the bottom center hole 40A to purge the buffer gas 37 from the bottom direction to the excitation region 30R through the bottom central hole 40A. The buffer gas 37 blown from the bottom center hole 40A helps block the debris of the target material 33 and plasma by-products from approaching the reflection surface 40R. In some embodiments, the flow rate of the buffer gas 37 through the bottom central hole 40A may be, but is not limited to, about 85 standard liter per minute (slm).

In some embodiments, the perimeter portion 403 of the collector 40 may further include one or more perimeter hole 40B between a perimeter of the collector 40 and the chamber 30, and the gas pipeline 38 may be in communication with the gas supplier 36 and the perimeter hole 40B to purge the buffer gas 37 from the lateral direction to the excitation region 30R through the perimeter hole 40B. The buffer gas 37 blown from the perimeter hole 40B helps block the debris of the target material 33 and plasma by-products from approaching the reflection surface 40R. In some embodiments, the flow rate of the buffer gas 37 through the perimeter hole 40B may be, but is not limited to, about 160 slm.

In some embodiments, the middle portion 402 of the collector 40 includes a plurality of openings. The gas pipeline 38 is in communication with the gas supplier 36 and the openings of the collector 40, and purges the buffer gas through the openings of the middle portion 402 to the excitation region 30R, and forms a gas protection layer near the reflection surface 40R of the collector 40. The gas protection layer helps block the debris of the target material 33 and plasma by-products from approaching the reflection surface 40R, and hence improves reflection effect of the collector 40, prolongs lifetime of the collector 40, and increases semiconductor fabrication productivity.

In some embodiments, the openings of the middle portion 402 include a plurality of holes 40X arranged in an array including a plurality of rows of holes 40X as shown in FIG. 3. In some embodiments, each of the holes 40X faces a direction normal to the reflection surface 40R of the collector 40, and therefore the buffer gas 37 can be blown from different directions, forming the gas protection layer substantially throughout the reflection surface 40R of the collector 40. The plurality of rows of holes 40X may be arranged concentrically. In some embodiments, the plurality of rows of holes 40X are substantially equally spaced. For example, the spacing of two adjacent rows of holes 40X is, but is not limited to, 20 mm. In some embodiments, the holes 40X in a same row are substantially equally spaced. For example, the spacing between two adjacent holes 40X in the same row is, but not limited to, about 20 mm. When deciding the dimension, shape, direction and density of the holes 40X, protection effect, fluid dynamics and reflection effect of the collector 40 should be considered. In some embodiments, the dimension e.g., diameter of the holes 40X may be the same. For example, the dimension e.g., diameter of each of the holes 40X is about 1 mm. In some embodiments, the ratio of the overall area of the plurality of holes 40X to the area of the reflection surface 40R is less than about 2%, or 1% e.g., 0.2%, and most reflection surface 40R can be maintained to reflect the electromagnetic radiation R. In some embodiments, the flow rate of the buffer gas 37 through the array of holes 40X may be, but is not limited to, about 202 slm. In some embodiments, the dimension e.g., diameter of the holes 40X may be different. For example, the dimension of the holes 40X near the bottom portion 401 may be larger than the dimension of the holes 40X near the perimeter portion 403 to locally enhance the gas protection effect near the bottom portion 401. In some other embodiments, the dimension of the holes 40X near the perimeter portion 403 may be larger than the dimension of the holes 40X near the bottom portion 401 to locally enhance the gas protection effect near the perimeter portion 403.

In some other embodiments, the plurality of rows of holes 40X may not be equally spaced. The holes 40X in a same row may not be equally spaced. The layout densities of the holes 40X in different rows may be different to locally adjust the gas protection effect in certain region of the collector 40. In some embodiments, the layout density of the holes 40X near the bottom portion 401 is different from a layout density of the holes 40X near the perimeter portion 403. For example, the layout density of the holes 40X near the bottom portion 401 is higher than a layout density of the holes 40X near the perimeter portion 403 to locally enhance the gas protection effect near the bottom portion 401. Alternatively, the layout density of the holes 40X near the perimeter portion 403 is higher than a layout density of the holes 40X near the bottom portion 401 to locally enhance the gas protection effect near the perimeter portion 403. Alternatively, the layout density of the holes 40X near the center of middle portion 402 is higher than a layout density of the holes 40X near the bottom portion 401 and higher than a layout density of the holes 40X near the perimeter portion 403 to locally enhance the gas protection effect near the center of the middle portion 402.

Figure 4A:
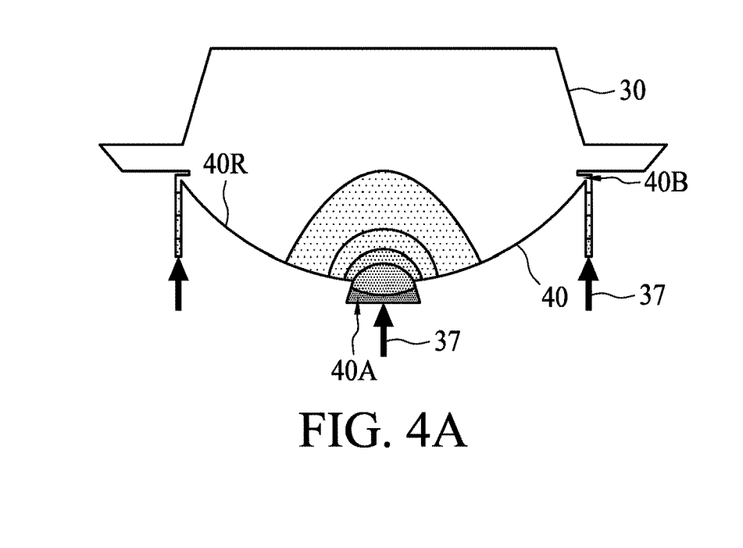
FIG. 4A illustrates a simulation result of a buffer gas concentration distribution in the radiation source when the buffer gas is purged to the collector from the bottom central hole and the perimeter hole.
Figure 4B:
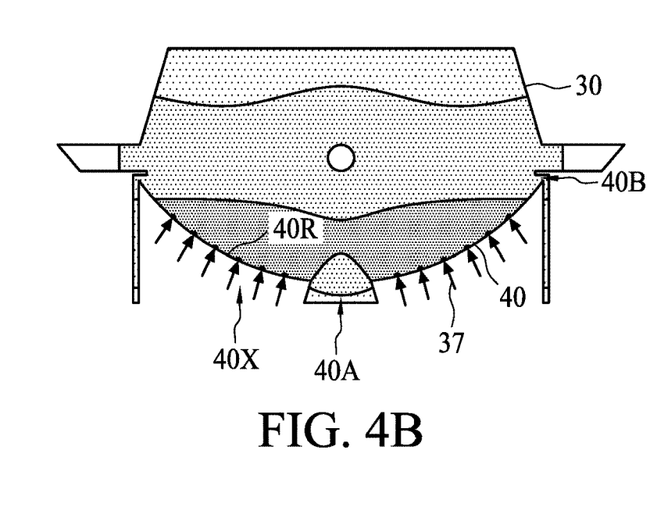
FIG. 4B illustrates a simulation result of a buffer gas concentration distribution in the radiation source when the buffer gas is purged to the collector from the array of holes.

Refer to FIGS. 4A and 4B. FIG. 4A illustrates a simulation result of a buffer gas concentration distribution in the radiation source when the buffer gas is purged to the collector from the bottom central hole and the perimeter hole, and FIG. 4B illustrates a simulation result of a buffer gas concentration distribution in the radiation source when the buffer gas is purged to the collector from the array of holes. In FIG. 4A and FIG. 4B, a darker grey tone represents a higher concentration of buffer gas. As shown in FIG. 4A, when the buffer gas 37 is purged through the bottom central hole 40A and the perimeter hole 40B, the buffer gas 37 is localized near the bottom center of the collector 40, while the rest of the reflection surface 40R of the collector 40 is not protected by the buffer gas 37. As shown in FIG. 4B, when the buffer gas 37 is purge through the array of holes 40X, the buffer gas 37 is distributed substantially throughout the collector 40, and the entire reflection surface 40R of the collector 40 is protected by the gas protection layer formed from the buffer gas 37.

Figure 5A:
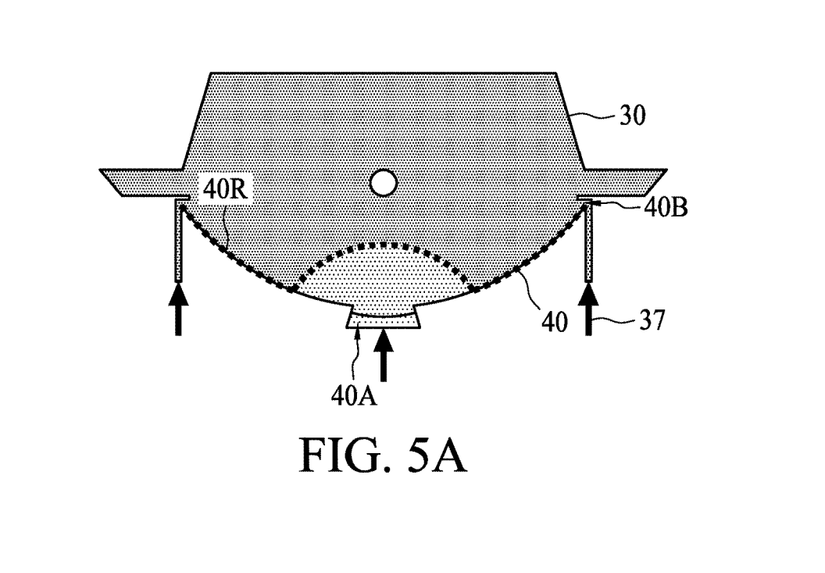
FIG. 5A illustrates a simulation result of a target material concentration distribution in the radiation source when the buffer gas is purged to the collector from the bottom central hole and the perimeter hole.
Figure 5B:
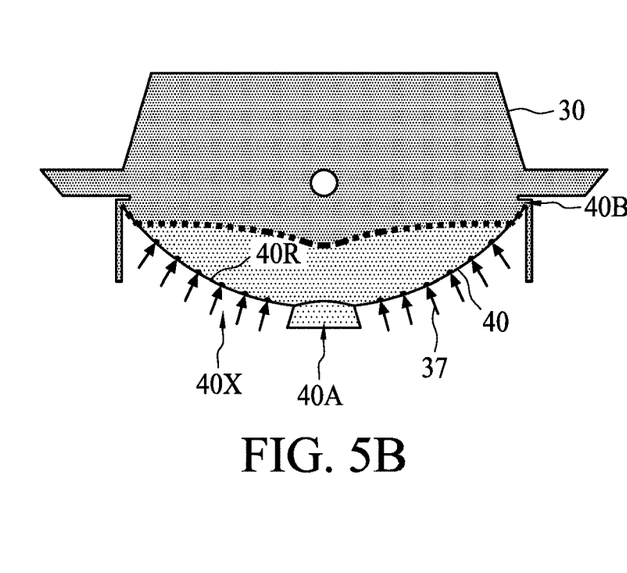
FIG. 5B illustrates a simulation result of a target material concentration distribution in the radiation source when the buffer gas is purged to the collector from the array of holes.

Refer to FIG. 5A and FIG. 5B. FIG. 5A illustrates a simulation result of a target material concentration distribution in the radiation source when the buffer gas is purged to the collector from the bottom central hole and the perimeter hole, and FIG. 5B illustrates a simulation result of a target material concentration distribution in the radiation source when the buffer gas is purged to the collector from the array of holes. In FIG. 5A and FIG. 5B, a darker grey tone represents a higher concentration of target material. As shown in FIG. 5A, when the buffer gas 37 is purged through the bottom central hole 40A and the perimeter hole 40B, the concentration of the target material is lower only in the region near the bottom center of the collector 40, while the concentration of the target material is higher in the rest region near the collector 40. As shown in FIG. 5B, when the buffer gas 37 is purge through the array of holes 40X, the concentration of the target material is low throughout all regions of the collector 40.

As can be seen in the simulation results of FIGS. 4A, 4B, 5A and 5B, the openings of the collector 40 facilitate the buffer gas 37 to form a gas protection layer throughout the reflection surface 40R of the collector 40, and effectively alleviate deposition of the target material on the reflection surface 40R. Accordingly, the reflection effect of the collector 40 can be improved, the lifetime of the collector 40 can be prolonged, and the fabrication productivity of semiconductor devices can be increased.

The electromagnetic radiation generation apparatus is not limited to the above-mentioned embodiments, and may have other different embodiments. To simplify the description and for the convenience of comparison between each of the embodiments of the present disclosure, the identical components in each of the following embodiments are marked with identical numerals. For making it easier to compare the difference between the embodiments, the following description will detail the dissimilarities among different embodiments and the identical features will not be redundantly described.

Figure 6:
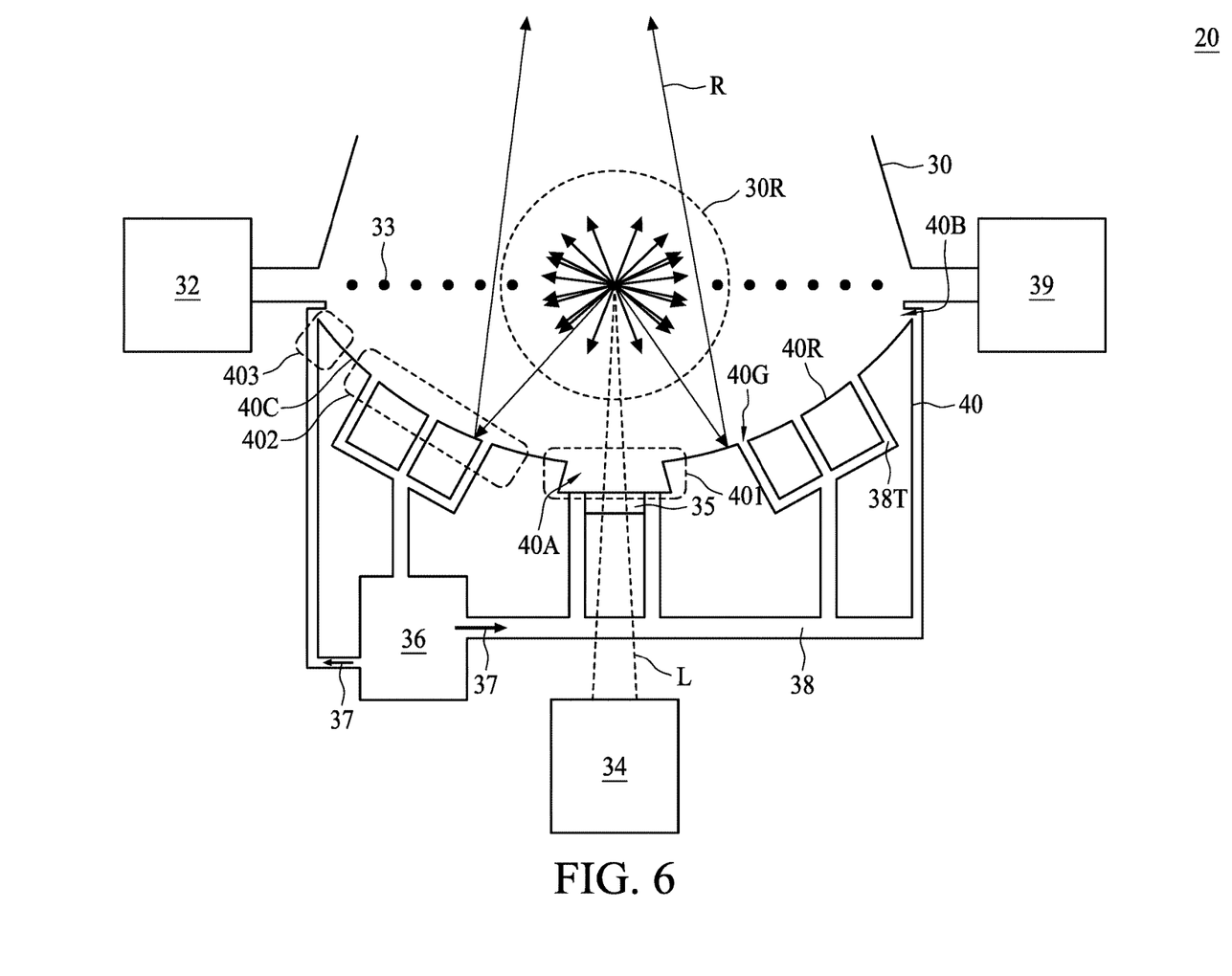
FIG. 6 is a schematic view diagram illustrating a radiation source, in accordance with some embodiments of the present disclosure.
Figure 7A:
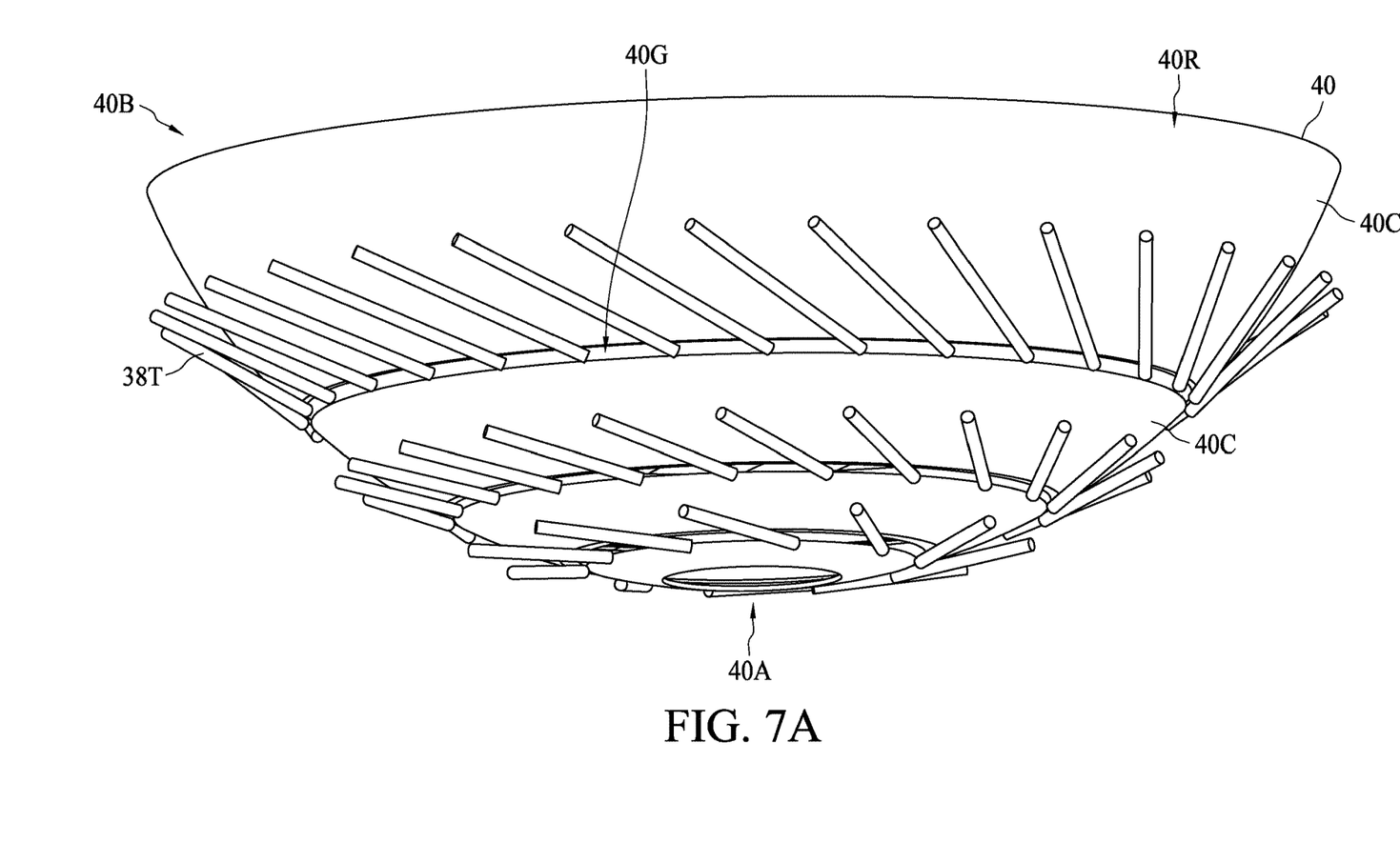
FIG. 7A is a perspective view diagram illustrating a collector, in accordance with some embodiments of the present disclosure.
Figure 7B:
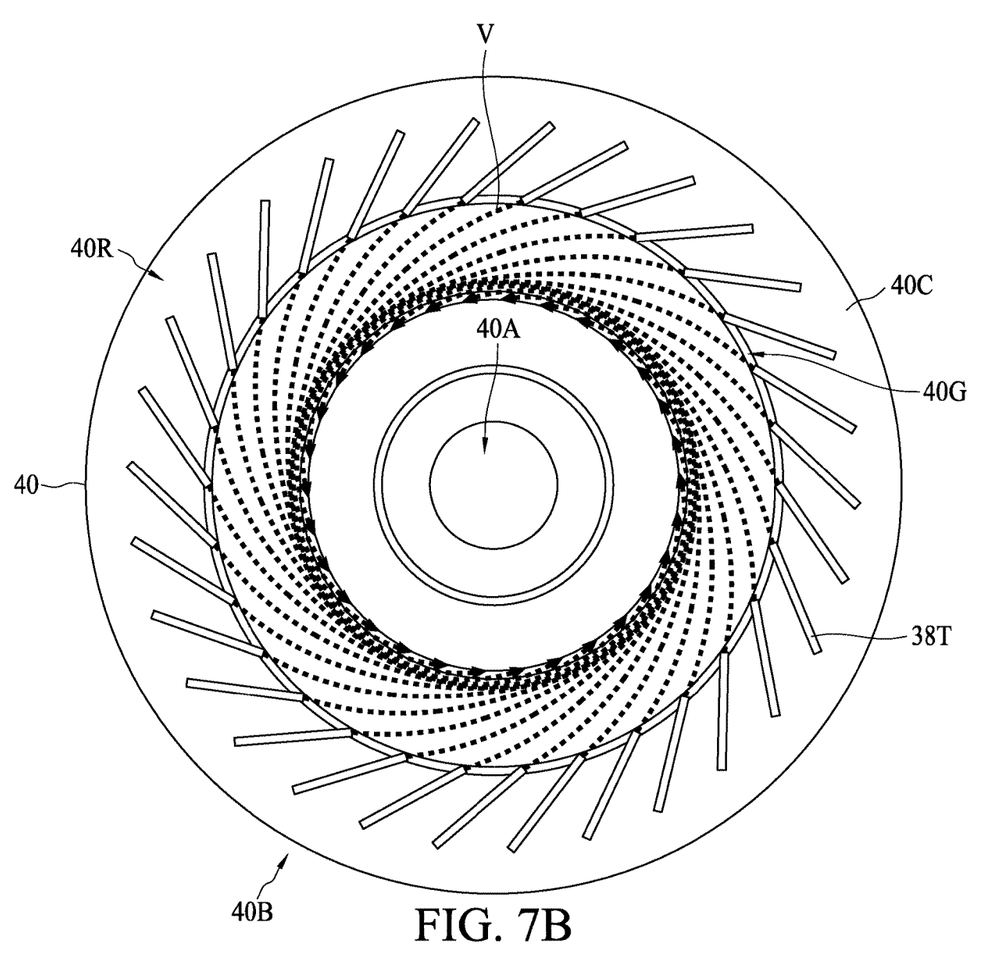
FIG. 7B is a top view diagram illustrating a collector, in accordance with some embodiments of the present disclosure.

Refer to FIG. 6, FIG. 7A and FIG. 7B. FIG. 6 is a schematic view diagram illustrating a radiation source, in accordance with some embodiments of the present disclosure. FIG. 7A is a perspective view diagram illustrating a collector, in accordance with some embodiments of the present disclosure, and FIG. 7B is a top view diagram illustrating a collector, in accordance with some embodiments of the present disclosure. As shown in FIGS. 1, 6, 7A and 7B, in contrast to the radiation source 20 of FIG. 2 and FIG. 3, the collector 40 of the radiation source 20 includes a plurality of gaps 40G. In some embodiments, the collector 40 includes a plurality of concentric ring structures 40C, and a reflection surface 40R configured to collect and reflect the electromagnetic radiation R. Two adjacent concentric ring structures 40C are separated by the gap 40G such as a concentric gap. In some embodiments, the concentric ring structures 40C may be connected to supporter(s) (not shown). The gas pipeline 38 is in communication with the gas supplier 36 and the gaps 40G of the collector 40, and configured to purge the buffer gas 37 to the excitation region 30R through the gaps 40G to reduce debris of the target material 33 and plasma by-products from being deposited on the reflection surface 40R of the collector 40. In some embodiments, each of the gaps 40G faces a direction normal to the reflection surface 40R of the collector 40. In some embodiments, the gaps 40G are arranged concentrically, but not limited thereto. In some other embodiments, the gaps 40G may be arranged radially. The gaps 40G may be substantially equally spaced. In some embodiments, the ratio of the overall area of the plurality of gaps 40G to the area of the reflection surface 40R is less than about 2%, or 1% e.g., 0.2%, and most reflection surface 40R can be maintained to reflect the electromagnetic radiation R. For example, the width of the gaps 40G is, but not limited to, about 5 mm. In some other embodiments, the gaps 40G may not be equally spaced.

In some embodiments, the gas pipeline 38 includes a plurality of sets of tubelets 38T connected to the plurality of gaps 40G, respectively, and configured to purge the buffer gas 37 through the tubelets 38T to form a turbulence in over the reflection surface 40R of the collector 40. In some embodiments, the dimension e.g., the diameter of the tubelet 38T is, but not limited to, about 2 mm. In some embodiments, the tubelets 38T corresponding to the same concentric gap 40G are arranged in a spiral swirl pattern. The tubelets 38T may be arranged, for example, in a clockwise manner or counter-clockwise manner. The tubelets 38T arranged in a spiral swirl pattern facilitates the buffer gas 37 purged there through to form a vortex V as denoted by the dotted arrows in FIG. 7B inside the collector 40. The gas vortex V may create a turbulence over the reflection surface 40R, thereby helping keep the debris of the target material 33 and plasma by-products from the reflection surface 40R during the excitation operation, and reducing deposition of the debris of the target material 33 and plasma by-products on the reflection surface 40R. In some embodiments, the tubelets 38T are arranged in a tilted manner. For example, the outlets of the tubelets 38T may face the bottom center of the collector 40. The tubelets 38T facing downward may facilitate the buffer gas 37 to blow downward, and create a turbulence throughout the reflection surface 40R. The turbulence over the collector 40 can help to keep the debris of the target material 33 and plasma by-products away from the reflection surface 40R of the collector 40, and protect the collector 40 from being damaged. In some embodiments, an average number of the tubelets 38T in each concentric gap 40G is substantially the same. In some other embodiments, an average number of the tubelets 38T in the concentric gap 40G near the bottom center hole 40A is different from an average number of the tubelets 38T in the concentric gap 40G near the perimeter hole 40B. For example, an average number of the tubelets 38T in the concentric gap 40G near the bottom center hole 40A is higher than an average number of the tubelets 38T in the concentric gap 40G near the perimeter hole 40B to locally enhance the gas protection effect near the bottom portion 401. In some other embodiments, an average number of the tubelets 38T in the concentric gap 40G near the perimeter hole 40B is higher than an average number of the tubelets 38T in the concentric gap 40G near the bottom center hole 40A to locally enhance the gas protection effect near the perimeter hole 40B.

In some embodiments, the tubelet 38T may include a nozzle for increasing pressure of the buffer gas 37. In some embodiments, the tubelets 38T corresponding to different gaps 40G may be arranged in different manner. For example, the tubelets 38T corresponding to one concentric gap 40G may be arranged in a clockwise manner, while the tubelets 38T corresponding to another concentric gap 40G may be arranged in a counter-clockwise manner.

Figure 8:
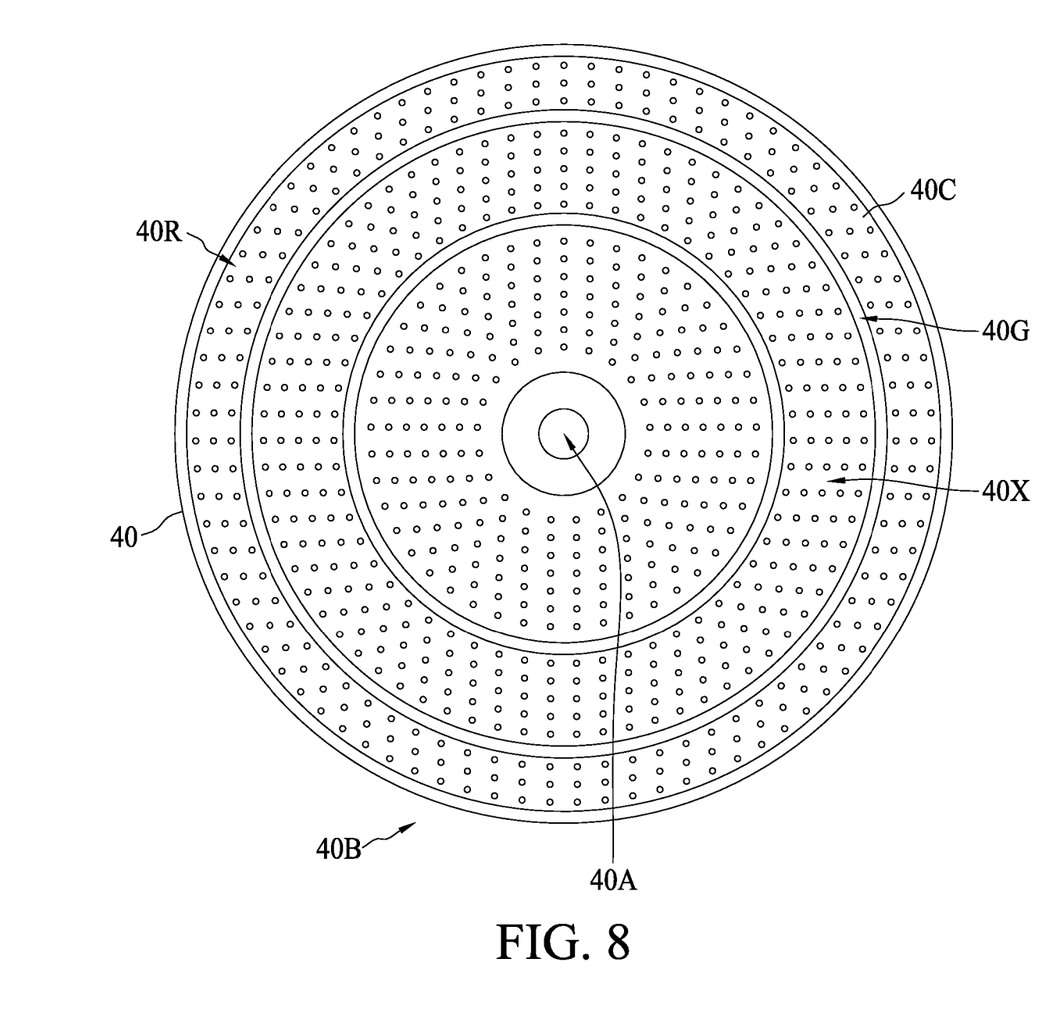
FIG. 8 is a top view diagram illustrating a collector, in accordance with some embodiments of the present disclosure.

Refer to FIG. 8. FIG. 8 is a top view diagram illustrating a collector, in accordance with some embodiments of the present disclosure. As shown in FIGS. 1 and 8, the collector 40 may include a combination of an array of holes 40X and a plurality of gaps 40G.

Figure 9:
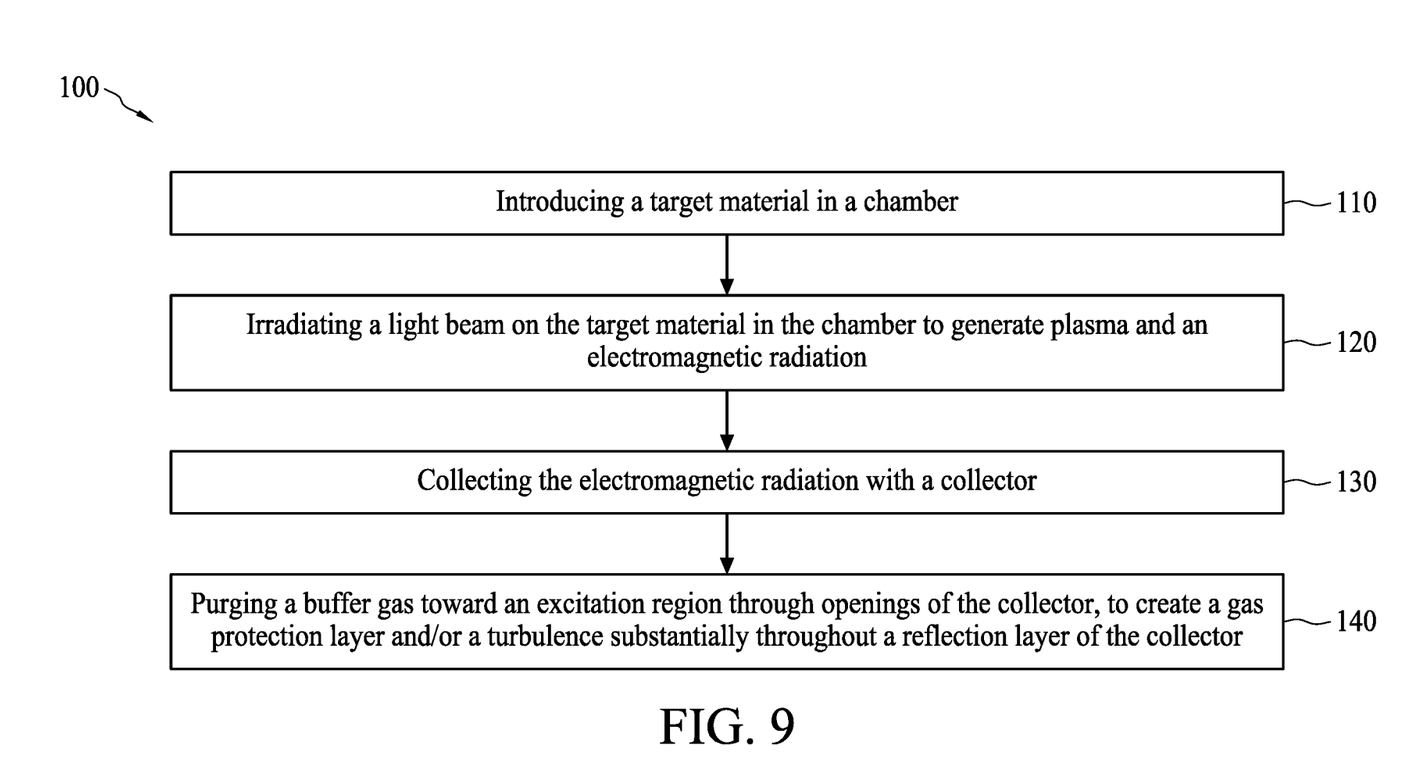
FIG. 9 is a flow chart illustrating a method for generating an electromagnetic radiation according to various aspects of one or more embodiments of the present disclosure.

FIG. 9 is a flow chart illustrating a method for generating an electromagnetic radiation according to various aspects of one or more embodiments of the present disclosure. The method 100 begins with operation 110 in which a target material is introduced in a chamber. The method 100 proceeds with operation 120 in which a light beam is irradiated on the target material in the chamber to generate plasma and an electromagnetic radiation. The method 100 proceeds with operation 130 in which the electromagnetic radiation is collected with a collector. The method 100 proceeds with operation 140 in which a buffer gas is purged toward an excitation region through openings of the collector, to create a gas protection layer and/or a turbulence substantially throughout a reflection layer of the collector. In some embodiments, the method 100 may be carried out by the aforementioned electromagnetic radiation generation apparatus as described to alleviate deposition of the target material on the reflection surface, improve the reflection effect of the collector, and prolong the lifetime of the collector.

The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method.

In the present disclosure, an apparatus and a method for generating an electromagnetic radiation such as EUV radiation are provided. The electromagnetic radiation generation apparatus includes a collector having openings for purging a buffer gas. The buffer gas purged through the openings of the collector helps to create a gas protection layer and/or a turbulence substantially throughout a reflection layer of the collector, which can alleviate deposition of the target material on the reflection surface, improve the reflection effect of the collector, and prolong the lifetime of the collector.

In some embodiments, an electromagnetic radiation generation apparatus includes a chamber, a collector, a gas supplier and a gas pipeline. The collector is disposed under the chamber, and the collector has a reflection surface configured to reflect an electromagnetic radiation. The collector includes a bottom portion, a perimeter portion, and a middle portion between the bottom portion and the perimeter portion, wherein the middle portion of the collector comprises a plurality of openings. The gas supplier is configured to provide a buffer gas. The gas pipeline is in communication with the gas supplier and the collector, and configured to purge the buffer gas through the openings of the middle portion to form a gas protection layer near the reflection surface of the collector.

In some embodiments, an electromagnetic radiation generation apparatus includes a chamber, a target material supplier, a light source, a collector, a gas supplier and a gas pipeline. The target material supplier is connected to the chamber and configured to supply a target material to the excitation region. The light source is configured to emit a light beam on the target material in the excitation region to generate plasma and an electromagnetic radiation. The collector is disposed under the chamber, the collector having a reflection surface configured to reflect the electromagnetic radiation, wherein the collector comprises a plurality of holes arranged in an array including a plurality of rows of holes. The gas supplier is configured to provide a buffer gas. The gas pipeline is in communication with the gas supplier and the holes of the collector, and configured to purge the buffer gas to the excitation region through the holes of the collector to reduce debris of the target material and plasma by-products from being deposited on the reflection surface of the collector.

In some embodiments, an electromagnetic radiation generation apparatus includes a chamber, a target material supplier, a light source, a collector, a gas supplier and a gas pipeline. The target material supplier is connected to the chamber and configured to supply a target material to an excitation region. The light source is configured to emit a light beam on the target material in the excitation region to generate plasma and an electromagnetic radiation. The collector is disposed under the chamber, the collector including a plurality of concentric ring structures and a reflection surface configured to collect and reflect the electromagnetic radiation, wherein two adjacent concentric ring structures are separated by a concentric gap. The gas supplier is configured to provide a buffer gas. The gas pipeline is in communication with the gas supplier and the concentric gaps of the collector, and configured to purge the buffer gas to the excitation region through the concentric gaps of the collector to reduce debris of the target material and plasma by-products from being deposited on the reflection surface of the collector.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An electromagnetic radiation generation apparatus, comprising:
   a collector having a reflection surface configured to reflect an electromagnetic radiation, wherein the collector includes a bottom portion, a perimeter portion, and a middle portion between the bottom portion and the perimeter portion, wherein the middle portion of the collector comprises a plurality of openings, and a layout density of the openings near the bottom portion is different from a layout density of the openings near the perimeter portion;
   a gas supplier configured to provide a buffer gas; and
   a gas pipeline in communication with the gas supplier and the collector, and configured to purge the buffer gas through the openings of the middle portion to form a gas protection layer near the reflection surface of the collector.

2. The electromagnetic radiation generation apparatus of claim 1, wherein each of the openings faces a direction normal to the reflection surface of the collector.

3. The electromagnetic radiation generation apparatus of claim 1, wherein the openings of the middle portion of the collector comprises a plurality of holes arranged in an array including a plurality of rows of holes, and each of the rows comprises a plurality of holes.

4. The electromagnetic radiation generation apparatus of claim 3, wherein the plurality of rows of holes are arranged concentrically.

5. The electromagnetic radiation generation apparatus of claim 3, wherein the plurality of rows of holes are substantially equally spaced, and the holes in a same row are substantially equally spaced.

6. The electromagnetic radiation generation apparatus of claim 1, wherein the openings of the middle portion of the collector comprises a plurality of gaps.

7. The electromagnetic radiation generation apparatus of claim 6, wherein the plurality of gaps are arranged concentrically and substantially equally spaced.

8. The electromagnetic radiation generation apparatus of claim 1, wherein the collector further comprises a bottom center hole in the bottom portion, and the gas pipeline is further in communication with the bottom center hole to purge the buffer gas through the bottom central hole.

9. The electromagnetic radiation generation apparatus of claim 1, further comprising a perimeter hole in the perimeter portion of the collector, and the gas pipeline is further in communication with the perimeter hole to purge the buffer gas through the perimeter hole.

10. An electromagnetic radiation generation apparatus, comprising:
    a chamber;
    a target material supplier connected to the chamber and configured to supply a target material to an excitation region;
    a light source configured to emit a light beam on the target material in the excitation region to generate plasma and an electromagnetic radiation;
    a collector disposed under the chamber, the collector having a reflection surface configured to reflect the electromagnetic radiation, wherein the collector comprises a plurality of holes arranged in an array including a plurality of rows of holes, and a number of holes in a first row is different from a number of holes in a second row;
    a gas supplier configured to provide a buffer gas; and
    a gas pipeline in communication with the gas supplier and the holes of the collector, and configured to purge the buffer gas to the excitation region through the holes of the collector to reduce debris of the target material and plasma by-products from being deposited on the reflection surface of the collector.

11. The electromagnetic radiation generation apparatus of claim 10, wherein the plurality of rows of holes are arranged concentrically.

12. The electromagnetic radiation generation apparatus of claim 10, wherein the collector further comprises a bottom center hole, and the gas pipeline is further in communication with the bottom center hole to purge the buffer gas to the excitation region through the bottom central hole.

13. The electromagnetic radiation generation apparatus of claim 10, further comprising a perimeter hole between a perimeter of the collector and the chamber, and the gas pipeline is further in communication with the perimeter hole to purge the buffer gas to the excitation region through the perimeter hole.

14. An electromagnetic radiation generation apparatus, comprising:
    a chamber;
    a target material supplier connected to the chamber and configured to supply a target material to an excitation region;
    a light source configured to emit a light beam on the target material in the excitation region to generate plasma and an electromagnetic radiation;
    a collector disposed under the chamber, the collector including a plurality of concentric ring structures and a reflection surface configured to collect and reflect the electromagnetic radiation, wherein two adjacent concentric ring structures defines a concentric gap having a ring shape, the two adjacent concentric ring structures are separated by the concentric gap, and the concentric gap extends through a width of the collector in an entire radial portion between the concentric ring structures;
    a gas supplier configured to provide a buffer gas; and
    a gas pipeline in communication with the gas supplier and the concentric gaps of the collector, and configured to purge the buffer gas to the excitation region through the concentric gaps of the collector to reduce debris of the target material and plasma by-products from being deposited on the reflection surface of the collector,
    wherein the gas pipeline comprises a plurality of sets of tubelets connected to the plurality of concentric gaps, respectively, and configured to form a turbulence in the excitation region, and the plurality of tubelets corresponding to the same concentric gap are arranged in a spiral swirl pattern.

15. The electromagnetic radiation generation apparatus of claim 14, wherein the collector further comprises a bottom center hole, the light source emits the light beam to the excitation region through the bottom center hole, and the gas pipeline is further in communication with the bottom center hole to purge the buffer gas to the excitation region through the bottom central hole.

16. The electromagnetic radiation generation apparatus of claim 15, further comprising a perimeter hole between a perimeter of the collector and the chamber, and the gas pipeline is further in communication with the perimeter hole to purge the buffer gas to the excitation region through the perimeter hole.

17. The electromagnetic radiation generation apparatus of claim 16, wherein an average number of the tubelets in the concentric gap near the bottom center hole is different from an average number of the tubelets in the concentric gap near the perimeter hole.

18. The electromagnetic radiation generation apparatus of claim 10, wherein a layout density of the holes in the first row is different from a layout density of the holes in the second row.

19. The electromagnetic radiation generation apparatus of claim 14, wherein a diameter of each of the tubelets is about 2 mm.

20. The electromagnetic radiation generation apparatus of claim 14, wherein each of the tubelets includes a nozzle.

* * * * *